United States Patent
Tseng et al.

(10) Patent No.: US 10,863,618 B2
(45) Date of Patent: Dec. 8, 2020

(54) COMPOSITE SUBSTRATE STRUCTURE AND MANUFACTURING METHOD THEREOF

(71) Applicant: Unimicron Technology Corp., Taoyuan (TW)

(72) Inventors: Tzyy-Jang Tseng, Taoyuan (TW); Pei-Wei Wang, Taipei (TW); Bo-Cheng Lin, Pingtung County (TW); Chun-Hsien Chien, New Taipei (TW); Chien-Chou Chen, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 77 days.

(21) Appl. No.: 16/283,670

(22) Filed: Feb. 22, 2019

(65) Prior Publication Data

US 2020/0196440 A1    Jun. 18, 2020

(30) Foreign Application Priority Data

Dec. 12, 2018   (TW) .............................. 107144688 A

(51) Int. Cl.
*H05K 1/02* (2006.01)
*H05K 1/11* (2006.01)
(Continued)

(52) U.S. Cl.
CPC .......... *H05K 1/0271* (2013.01); *H01Q 1/241* (2013.01); *H01Q 1/38* (2013.01); *H05K 1/0237* (2013.01);
(Continued)

(58) Field of Classification Search
CPC ........ H01Q 1/38; H05K 1/0271; H05K 1/113; H05K 1/181; H05K 3/303; H05K 3/4644;
(Continued)

(56) References Cited

U.S. PATENT DOCUMENTS 9,307,641 B2 * 4/2016 Oi ......................... H05K 1/111
9,412,687 B2 * 8/2016 Kunimoto ......... H01L 23/49811
(Continued)

FOREIGN PATENT DOCUMENTS

TW   200839997   10/2008
TW   201618241    5/2016

OTHER PUBLICATIONS

"Office Action of Taiwan Counterpart Application", dated Aug. 15, 2019, p. 1-p. 9.

*Primary Examiner* — Thai Pham
(74) *Attorney, Agent, or Firm* — JCIPRNET

(57) ABSTRACT

A composite substrate structure includes a circuit substrate, a first anisotropic conductive film, a first glass substrate, a dielectric layer, a patterned circuit layer and a conductive via. The first anisotropic conductive film is disposed on the circuit substrate. The first glass substrate is disposed on the first anisotropic conductive film and has a first surface and a second surface opposite to the first surface. The first glass substrate includes a first circuit layer, a second circuit layer and at least one first conductive via. The first circuit layer is disposed on the first surface. The second circuit layer is disposed on the second surface. The first conductive via penetrates the first glass substrate and is electrically connected to the first circuit layer and the second circuit layer. The first glass substrate and the circuit substrate are respectively located on two opposite sides of the first anisotropic conductive film.

15 Claims, 8 Drawing Sheets

(51) Int. Cl.
*H05K 3/30* (2006.01)
*H05K 3/46* (2006.01)
*H01Q 3/38* (2006.01)
*H01Q 1/24* (2006.01)
*H01Q 1/38* (2006.01)
*H05K 3/02* (2006.01)
*H05K 3/40* (2006.01)
*H05K 1/18* (2006.01)

(52) U.S. Cl.
CPC ............ *H05K 1/113* (2013.01); *H05K 1/181* (2013.01); *H05K 3/027* (2013.01); *H05K 3/303* (2013.01); *H05K 3/4015* (2013.01); *H05K 3/4038* (2013.01); *H05K 3/4644* (2013.01); *H05K 3/4697* (2013.01); *H05K 2201/10234* (2013.01); *H05K 2201/10545* (2013.01)

(58) Field of Classification Search
CPC .......... H05K 3/4038; H05K 1/02; H05K 1/11; H05K 3/30; H05K 3/40; H05K 3/46; H05K 2201/10234
See application file for complete search history.

(56) References Cited

U.S. PATENT DOCUMENTS

| | | | |
|---|---|---|---|
| 9,985,346 B2 | 5/2018 | Baks et al. | |
| 2005/0236176 A1* | 10/2005 | Hsu | H05K 1/0269 174/250 |
| 2007/0205520 A1* | 9/2007 | Chou | H01L 24/48 257/780 |
| 2008/0083558 A1* | 4/2008 | Chujo | H05K 3/4644 174/250 |
| 2008/0230260 A1* | 9/2008 | Shih | H01L 23/15 174/257 |
| 2016/0135289 A1* | 5/2016 | Cho | H05K 1/0271 174/251 |
| 2016/0351532 A1* | 12/2016 | Akutsu | H05K 1/0269 |
| 2016/0374198 A1* | 12/2016 | Kim | H05K 1/0271 |
| 2018/0159203 A1 | 6/2018 | Baks et al. | |

* cited by examiner

COMPOSITE SUBSTRATE STRUCTURE AND MANUFACTURING METHOD THEREOF

CROSS-REFERENCE TO RELATED APPLICATION

This application claims the priority benefit of Taiwan application serial no. 107144688, filed on Dec. 12, 2018. The entirety of the above-mentioned patent application is hereby incorporated by reference herein and made a part of this specification.

BACKGROUND OF THE INVENTION

1. Field of the Invention

The present invention relates to a substrate structure and a manufacturing method thereof, and particularly to a composite substrate structure and a manufacturing method thereof.

2. Description of Related Art

At present, regardless of the thickness of a multilayer printed circuit board, it is easy to generate warpage in a back-end packaging process due to the difference in the coefficient of thermal expansion (CTE) of the material, thereby affecting the yield of the back-end packaging process, the flatness of the multilayer printed circuit board and the reliability of components.

Therefore, if the above-mentioned multilayer printed circuit board is applied to the structural design of a 5G antenna, it is possible to change the size of an air cavity in the 5G antenna structure due to the poor flatness of the multilayer printed circuit board, which in turn reduces the receiving capability and bandwidth of the 5G antenna.

SUMMARY OF THE INVENTION

The present invention provides a composite substrate structure having better flatness and reliability.

The present invention provides a manufacturing method of the composite substrate structure, which is used for manufacturing the above composite substrate structure, and has better yield.

The composite substrate structure of the present invention includes a circuit substrate, a first anisotropic conductive film, a first glass substrate, a dielectric layer, a patterned circuit layer and a conductive via. The first anisotropic conductive film is disposed on the circuit substrate. The first glass substrate is disposed on the first anisotropic conductive film and has a first surface and a second surface opposite to the first surface. The first glass substrate includes a first circuit layer, a second circuit layer and at least one first conductive via. The first circuit layer is disposed on the first surface. The second circuit layer is disposed on the second surface. The first conductive via penetrates the first glass substrate and is electrically connected to the first circuit layer and the second circuit layer. The dielectric layer is disposed on the first surface of the first glass substrate and covers the first circuit layer. The patterned circuit layer is disposed on the dielectric layer. The conductive via penetrates the dielectric layer and is electrically connected to the patterned circuit layer and the first circuit layer. The first glass substrate and the circuit substrate are respectively located on two opposite sides of the first anisotropic conductive film.

In an embodiment of the present invention, the circuit substrate includes a first dielectric layer, a first conductive layer, a second conductive layer, a first conductive hole, a second dielectric layer, a third conductive layer and a second conductive hole. The first dielectric layer has an upper surface and a lower surface opposite to each other. The first conductive layer is disposed on the upper surface of the first dielectric layer. The second conductive layer is disposed on the lower surface of the first dielectric layer. The first conductive hole penetrates the first dielectric layer and is electrically connected to the first conductive layer and the second conductive layer. The second dielectric layer is disposed on the first dielectric layer and covers the first conductive layer. The third conductive layer is disposed on the second dielectric layer. The second conductive hole penetrates the second dielectric layer and is electrically connected to the third conductive layer and the first conductive layer.

In an embodiment of the present invention, the first conductive via of the first glass substrate is disposed opposite to the second conductive hole of the circuit substrate.

In an embodiment of the present invention, the composite substrate structure further includes at least one solder ball and one chip. The solder ball and the chip are respectively disposed on the lower surface of the first dielectric layer of the circuit substrate such that the solder ball and the chip are electrically connected to the second conductive layer.

In an embodiment of the present invention, the first glass substrate is electrically connected to the circuit substrate through the first anisotropic conductive film.

In an embodiment of the present invention, the composite substrate structure further includes a second anisotropic conductive film and at least two second glass substrates. The second anisotropic conductive film is disposed on the circuit substrate. The at least two second glass substrates are respectively disposed on the second anisotropic conductive film. The second glass substrate has a third surface and a fourth surface opposite to each other. The second glass substrate includes a third circuit layer, a fourth circuit layer and a second conductive via. The third circuit layer is disposed on the third surface. The fourth circuit layer is disposed on the fourth surface. The second conductive via penetrates the second glass substrate and is electrically connected to the third circuit layer and the fourth circuit layer. The first glass substrate and the circuit substrate are respectively located on two opposite sides of the second glass substrate. The second glass substrate and the circuit substrate are respectively located on two opposite sides of the second anisotropic conductive film.

In an embodiment of the present invention, the first glass substrate is electrically connected to the circuit substrate through the first anisotropic conductive film, the second glass substrate and the second anisotropic conductive film.

In an embodiment of the present invention, the circuit substrate further includes a first antenna layer disposed on the circuit substrate. The first glass substrate further includes a second antenna layer and a third antenna layer respectively disposed on the first surface and the second surface of the first glass substrate. The composite substrate structure further includes an electronic component disposed on the dielectric layer and electrically connected to the conductive via.

In an embodiment of the present invention, the first glass substrate, the at least two second glass substrates and the circuit substrate are mutually assembled to form an accommodating space. The first antenna layer and the third antenna layer are located in the accommodating space and separated from each other.

The manufacturing method of the composite substrate structure of the present invention includes the following steps: providing a circuit substrate; laminating a first anisotropic conductive film onto the circuit substrate; disposing a first glass substrate on the first anisotropic conductive film, the first glass substrate having a first surface and a second surface opposite to the first surface, and the first glass substrate including a first circuit layer, a second circuit layer and at least one first conductive via, where the first circuit layer is disposed on the first surface, the second circuit layer is disposed on the second surface, and the first conductive via penetrates the first glass substrate and is electrically connected to the first circuit layer and the second circuit layer; laminating a dielectric layer onto the first surface of the first glass substrate and covering the first circuit layer; and forming a conductive via penetrating the dielectric layer; and forming a patterned circuit layer on the dielectric layer, where the conductive via is electrically connected to the patterned circuit layer and the first circuit layer, and the first glass substrate and the circuit substrate are respectively located on two opposite sides of the first anisotropic conductive film.

In an embodiment of the present invention, the step of forming the first glass substrate includes the following steps: providing a glass substrate, the glass substrate having a first surface, a second surface opposite to the first surface, and at least one via penetrating the glass substrate; forming a seed layer on the first surface and the second surface and in the via of the glass substrate; forming a patterned photoresist layer on the seed layer of the first surface and on the seed layer of the second surface; forming a conductive material layer on the seed layer exposed by the patterned photoresist layer; and removing the patterned photoresist layer, a part of the conductive material layer and a part of the seed layer to form the first circuit layer, the second circuit layer and the first conductive via.

In an embodiment of the present invention, the manufacturing method of the composite substrate structure further includes: disposing at least one solder ball and one chip respectively on the lower surface of the first dielectric layer of the circuit substrate such that the solder ball and the chip are electrically connected to the second conductive layer.

In an embodiment of the present invention, before laminating the first anisotropic conductive film onto the circuit substrate, the manufacturing method of the composite substrate structure further includes the following steps: laminating a second anisotropic conductive film onto the circuit substrate; and disposing at least two second glass substrates respectively on the second anisotropic conductive film, the second glass substrate having a third surface and a fourth surface opposite to each other, and the second glass substrate including a third circuit layer, a fourth circuit layer and a second conductive via, where the third circuit layer is disposed on the third surface, the fourth circuit layer is disposed on the fourth surface, and the second conductive via penetrates the second glass substrate and is electrically connected to the third circuit layer and the fourth circuit layer; and the first glass substrate and the circuit substrate are respectively located on two opposite sides of the second glass substrate, and the second glass substrate and the circuit substrate are respectively located on two opposite sides of the second anisotropic conductive film.

Based on the above, in the composite substrate structure and the manufacturing method thereof of the present invention, the composite substrate structure includes a circuit substrate, a first anisotropic conductive film, a first glass substrate, a dielectric layer, a patterned circuit layer and a conductive via, where the first anisotropic conductive film is disposed on the circuit substrate, and the first glass substrate is disposed on the first anisotropic conductive film, such that the first glass substrate and the circuit substrate are respectively located on two opposite sides of the first anisotropic conductive film. In addition, the first glass substrate includes a first circuit layer, a second circuit layer and at least one first conductive via. The first circuit layer is disposed on the first surface of the first glass substrate. The second circuit layer is disposed on the second surface of the first glass substrate. The first conductive via penetrates the first glass substrate and is electrically connected to the first circuit layer and the second circuit layer. With this design, the composite substrate structure of the present invention has better flatness and reliability, and the manufacturing method of the composite substrate structure of the present invention has better yield.

In order to make the aforementioned and other objectives and advantages of the present invention comprehensible, embodiments accompanied with figures are described in detail below.

DESCRIPTION OF THE EMBODIMENTS

FIG. 1A to FIG. 1G are schematic cross-sectional views showing a manufacturing method of a composite substrate structure according to an embodiment of the present invention.

Figure 1A:
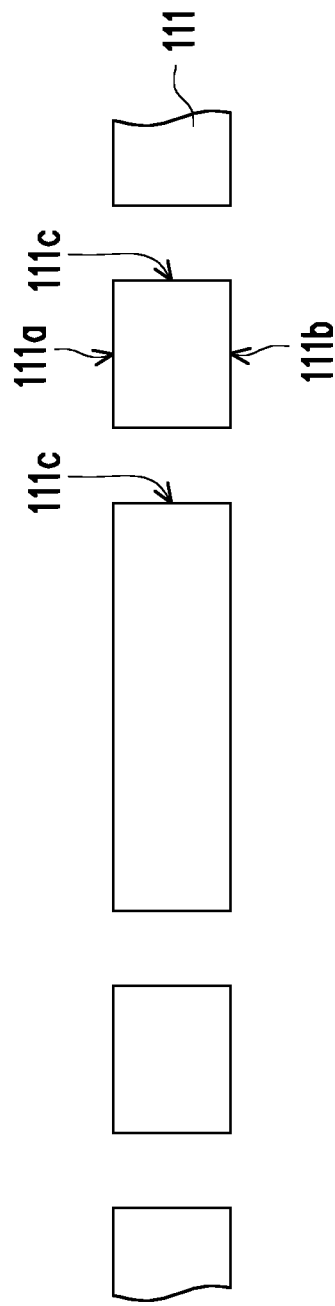
FIG. 1A to FIG. 1G are schematic cross-sectional views showing a manufacturing method of a composite substrate structure according to an embodiment of the present invention.

Referring to FIG. 1A to FIG. 1E, in the manufacturing method of a composite substrate structure 100 of the present embodiment, a first glass substrate 110 is firstly formed. Firstly, referring to FIG. 1A, a glass substrate 111 is provided, where the glass substrate 111 has a first surface 111*a*, a second surface 111*b* opposite to the first surface 111*a* and at least one via 111*c* penetrating the glass substrate (4 vias are schematically illustrated in FIG. 1A, but are not limited thereto). The via 111*c* communicates the first surface 111*a* and the second surface 111*b*. In the present embodiment, the via 111*c* is formed by, for example, drilling the glass substrate 111 in a laser manner, but not limited thereto. Herein, the thickness of the glass substrate 111 is, for example, between 100 micrometers and 200 micrometers, but is not limited thereto.

Figure 1B:
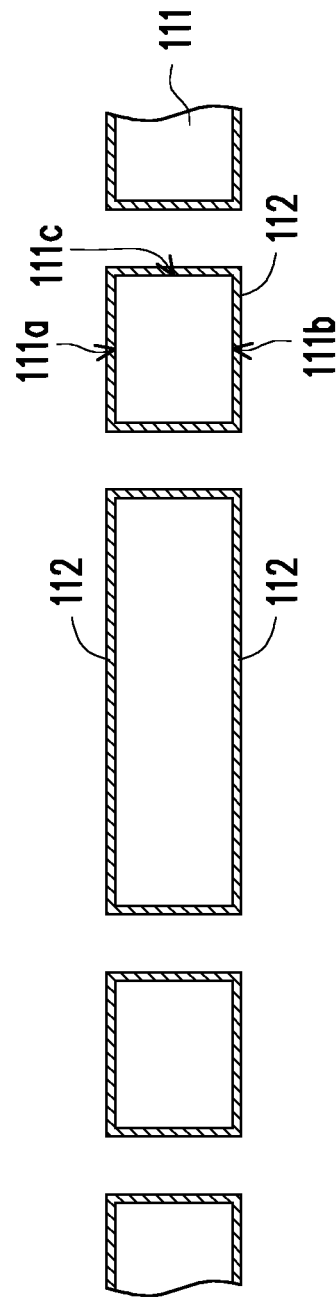

Next, referring to FIG. 1B, a seed layer 112 is formed on the first surface 111*a* and the second surface 111*b* and in the via 111*c* of the glass substrate 111. In some embodiments, the seed layer 112 may be a metal layer, and the metal layer may be a single layer or a composite layer including a plurality of sub-layers formed of different materials. In some embodiments, the seed layer 112 includes a titanium layer and a copper layer located on the titanium layer. The seed layer 112 may be formed by using a method such as sputter or physical vapor deposition (PVD).

Figure 1C:
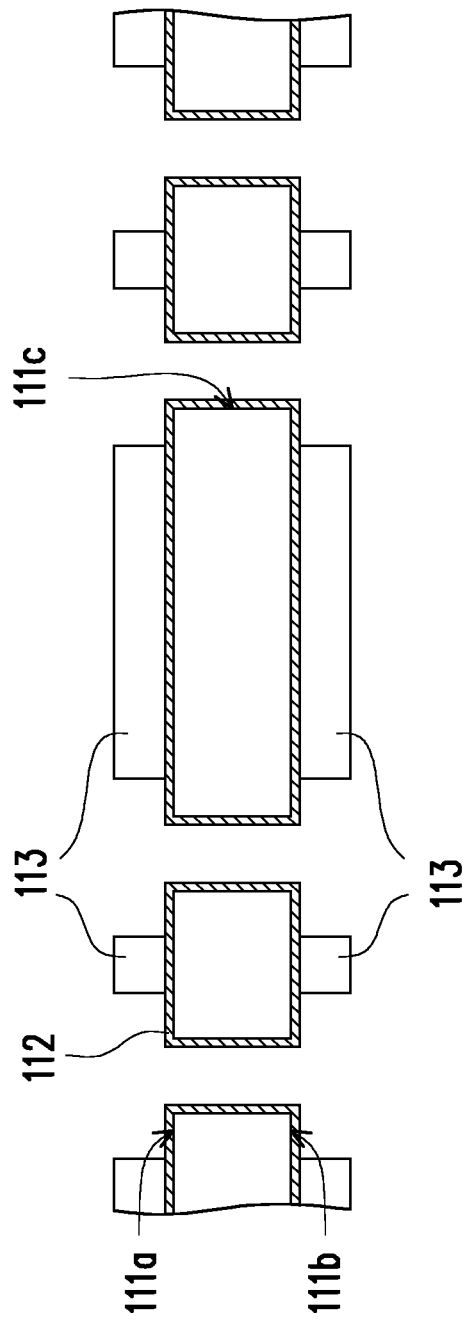

Next, referring to FIG. 1C, a patterned photoresist layer 113 is formed on the seed layer 112 of the first surface 111a and on the seed layer 112 of the second surface 111b. In detail, in the present embodiment, a photoresist layer (not shown) may be firstly formed on the seed layer 112 of the first surface 111a and the second surface 111b by a method of spin coating, dry film type photosensitive dielectric patterning, or the like, and the photoresist layer is patterned by exposure development to form the patterned photoresist layer 113.

Figure 1D:
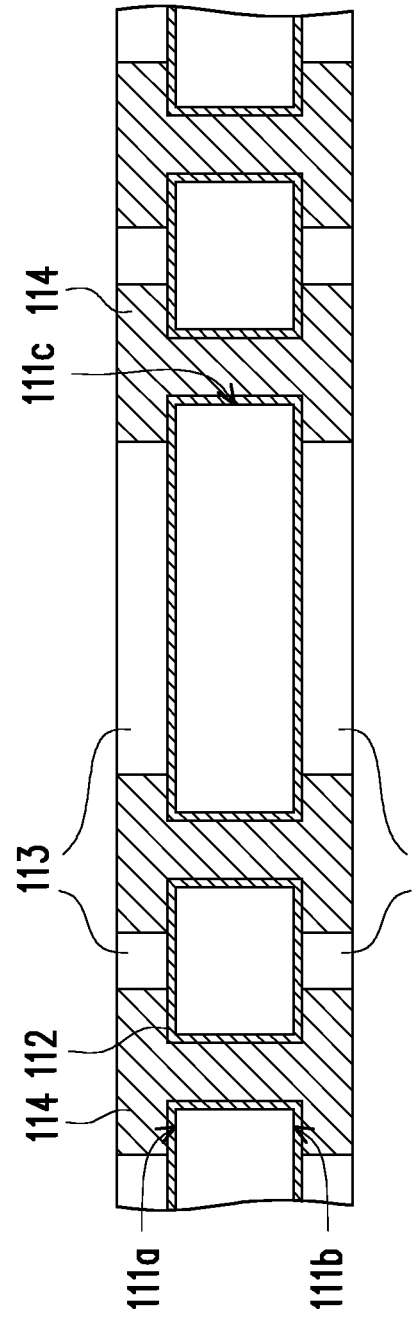

Then, referring to FIG. 1D, a conductive material layer 114 is formed on the seed layer 112 exposed by the patterned photoresist layer 113. In detail, in the present embodiment, the conductive material layer 114 may be formed in an opening of the patterned photoresist layer 113 and on the exposed seed layer 112 by a plating process such as plating. In some embodiments, the conductive material layer 114 may be a metal or metal alloy, for example, copper, titanium, tungsten, aluminum or the like, or a combination thereof.

Figure 1E:
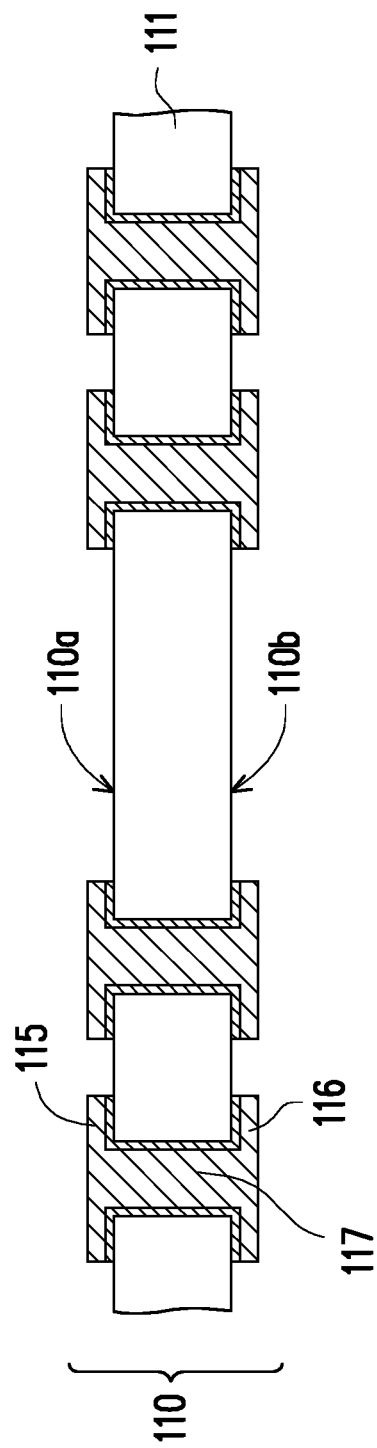

Next, referring to both FIG. 1D and FIG. 1E, the patterned photoresist layer 113 is removed firstly, and then a part of the conductive material layer 114 and a part of the seed layer 112 are removed by etching. The part of the seed layer 112 is a part of the seed layer 112 covered by the patterned photoresist layer 113 before the patterned photoresist layer 113 is removed. At this time, after the part of the conductive material layer 114 and the part of the seed layer 112 are removed, the remaining part of the seed layer 112 and the remaining part of the conductive material layer 114 form the first circuit layer 115, the second circuit layer 116 and the first conductive via 117. At this time, the manufacturing of the first glass substrate 110 of the present embodiment has been completed, as shown in FIG. 1E, where the first circuit layer 115 is disposed on the first surface 110a of the first glass substrate 110. The second circuit layer 116 is disposed on the second surface 110b of the first glass substrate 110. The first conductive via 117 penetrates the first glass substrate 110 and is electrically connected to the first circuit layer 115 and the second circuit layer 116.

Figure 1F:
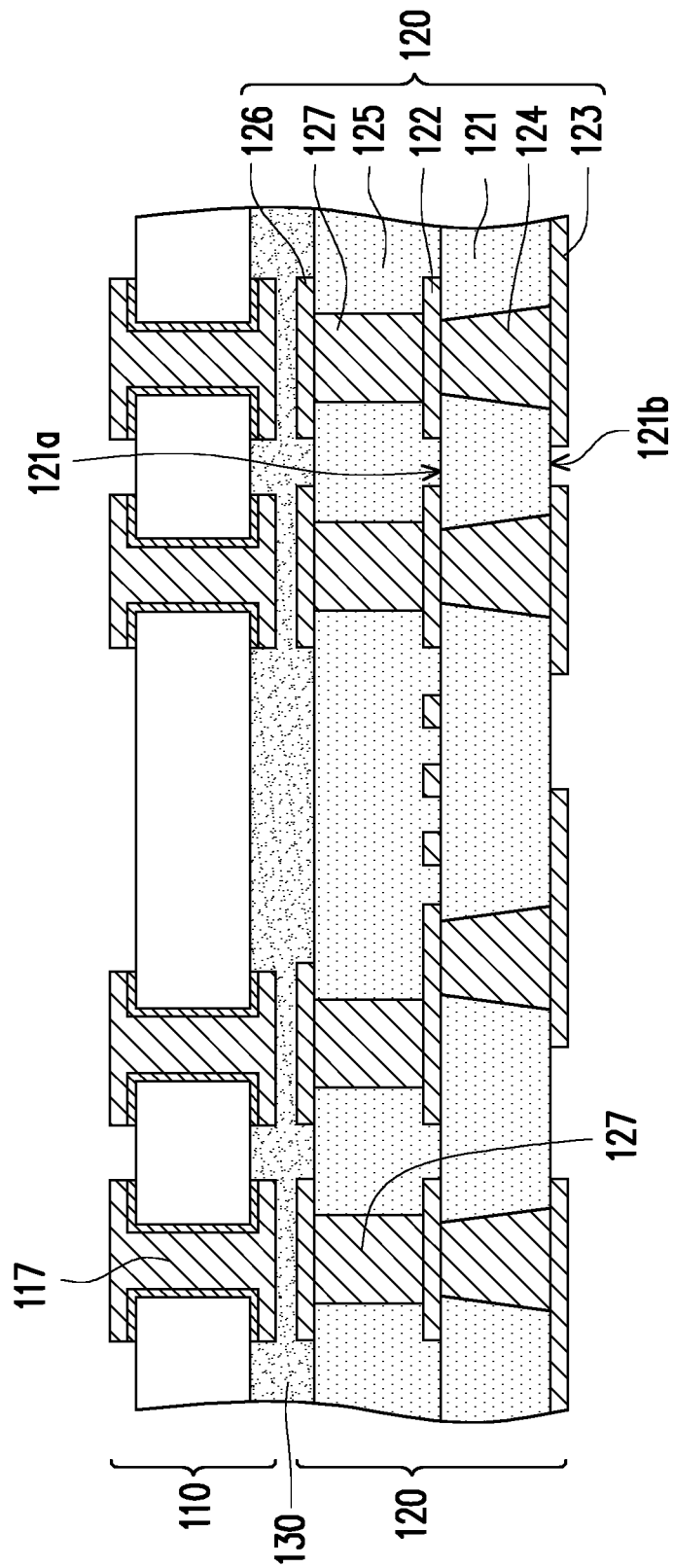

Then, referring to FIG. 1F, a circuit substrate 120 is provided, a first anisotropic conductive film (ACF) 130 is laminated onto the circuit substrate 120, and the first glass substrate 110 is disposed on the first anisotropic conductive film 130. In detail, in the present embodiment, the circuit substrate 120 is a multilayer circuit-added structure, and includes, for example, a first dielectric layer 121, a first conductive layer 122, a second conductive layer 123, a first conductive hole 124, a second dielectric layer 125, a third conductive layer 126 and a second conductive hole 127, where the first dielectric layer 121 has an upper surface 121a and a lower surface 121b opposite to each other. The first conductive layer 122 is disposed on the upper surface 121a of the first dielectric layer 121. The second conductive layer 123 is disposed on the lower surface 121b of the first dielectric layer 121. The first conductive hole 124 penetrates the first dielectric layer 121 and is electrically connected to the first conductive layer 122 and the second conductive layer 123. In addition, the second dielectric layer 125 is disposed on the first dielectric layer 121 and covers the first conductive layer 122. The third conductive layer 126 is disposed on the second dielectric layer 125, and the third conductive layer 126 and the first conductive layer 122 are respectively located on two opposite sides of the second dielectric layer 125. The second conductive hole 127 penetrates the second dielectric layer 125 and is electrically connected to the third conductive layer 126 and the first conductive layer 122.

It needs to be stated that although the circuit substrate 120 of the present embodiment includes two dielectric layers and three conductive layers, the invention does not limit the number of dielectric layers and conductive layers. In other words, in the circuit substrate of other embodiments, the number of dielectric layers (or conductive layers) may be one or two or more, as long as the dielectric layer and the conductive layer are alternately stacked to form a circuit laminar structure.

Next, the first anisotropic conductive film 130 is laminated onto the second dielectric layer 125 of the circuit substrate 120 such that the first anisotropic conductive film 130 covers the second dielectric layer 125 and the third conductive layer 126. Herein, since the anisotropic conductive film has a characteristic that the upper and lower (Z axis) current is conducted but the left and right planes (X, Y axis) are insulated, it is suitable for connecting two different substrate materials, for example, the first glass substrate 110 and the circuit substrate 120 in the present embodiment, thereby forming the composite substrate structure.

Then, the first glass substrate 110 is disposed on the first anisotropic conductive film 130, and the first glass substrate 110 and the circuit substrate 120 are respectively located on two opposite sides of the first anisotropic conductive film 130. Herein, the first conductive via 117 of the first glass substrate 110 is disposed opposite to the second conductive hole 127 of the circuit substrate 120. Therefore, although the first conductive via 117 of the first glass substrate 110 is not in direct contact with the second conductive hole 127 of the circuit substrate 120, the first glass substrate 110 may still be electrically connected to the circuit substrate 120 through conductive particles in the first anisotropic conductive film 130.

Figure 1G:
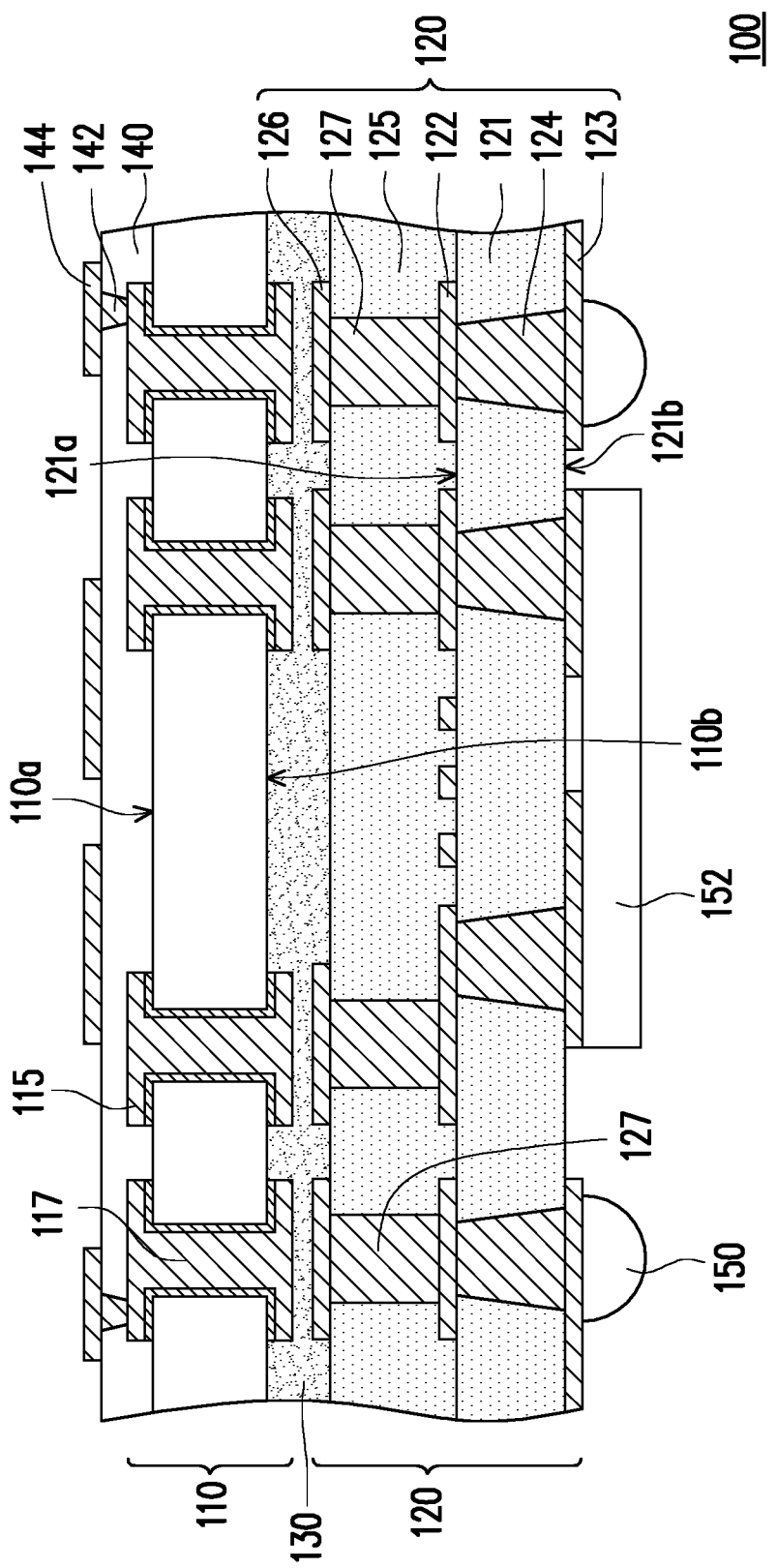

Next, referring to FIG. 1G, a dielectric layer 140, a conductive via 142 and a patterned circuit layer 144 are formed on the first glass substrate 110, and a solder ball 150 and a chip 152 are respectively disposed on the first dielectric layer 121 of the circuit substrate 120. In detail, the dielectric layer 140 is laminated onto the first surface 110a of the first glass substrate 110 such that the dielectric layer 140 covers the first surface 110a of the first glass substrate 110 and the first circuit layer 115. The conductive via 142 is formed in the dielectric layer 140 such that the conductive via 142 penetrates the dielectric layer 140 and is electrically connected to the first circuit layer 115. The patterned circuit layer 144 is formed on the dielectric layer 140 such that the patterned circuit layer 144 and the first circuit layer 115 are respectively located on two opposite sides of the dielectric layer 140. The patterned circuit layer 144 may be electrically connected to the first circuit layer 115 through the conductive via 142.

Then, the solder ball 150 and the chip 152 are respectively disposed on the lower surface 121b of the first dielectric layer 121 of the circuit substrate 120 such that the solder ball 150 and the chip 152 are electrically connected to the second conductive layer 123. At this time, the manufacturing of the composite substrate structure 100 of the present embodiment has been completed.

It needs to be stated that, in the composite substrate structure 100 of the present embodiment, since the glass material used in the first glass substrate 110 has the advantages of low coefficient of thermal expansion and high flatness, the formed first glass substrate 110 has good flatness and avoids warpage during the manufacturing process of the composite substrate structure 100. In addition, since the first glass substrate 110 has good flatness, a process of circuit thinning may be realized thereon, that is, the patterned circuit layer 144 and the conductive via 142 in the present embodiment may be thin circuits.

It needs to be stated that in the composite substrate structure 100 of the present embodiment, the patterned circuit layer 144 may serve as an antenna and has a function of receiving a signal. In addition, the patterned circuit layer 144 may be electrically connected to the first glass substrate 110 through the conductive via 142, the first glass substrate 110 may be electrically connected to the circuit substrate 120 through the first anisotropic conductive film 130, the circuit substrate 120 may be electrically connected to the chip 152 through the second conductive layer 123, and therefore, the patterned circuit layer 144 as the antenna may transmit the received signal into the chip 152.

In short, the composite substrate structure 100 of the present embodiment includes the circuit substrate 120, the first anisotropic conductive film 130, the first glass substrate 110, the dielectric layer 140, the patterned circuit layer 144 and the conductive via 142. The first anisotropic conductive film 130 is disposed on the circuit substrate 120, and the first glass substrate 110 is disposed on the first anisotropic conductive film 130. The first circuit layer 115 is disposed on the first surface 110a of the first glass substrate 110. The second circuit layer 116 is disposed on the second surface 110b of the first glass substrate 110. The first conductive via 117 penetrates the first glass substrate 110 so as to be electrically connected to the first circuit layer 115 and the second circuit layer 116. The dielectric layer 140 is disposed on the first surface 110a of the first glass substrate 110 and covers the first circuit layer 115. The patterned circuit layer 144 is disposed on the dielectric layer 140. The conductive via 142 penetrates the dielectric layer 140 and is electrically connected to the patterned circuit layer 144 and the first circuit layer 115. The first glass substrate 110 and the circuit substrate 120 are respectively located on two opposite sides of the first anisotropic conductive film 130. With this design, the composite substrate structure of the present invention has better flatness and reliability, and the manufacturing method of the composite substrate structure of the present invention has better yield.

Other embodiments are listed below for illustration. It must be stated herein that the following embodiments follow the reference numerals and partial contents of the preceding embodiments, where the identical reference numerals are used to denote identical or similar elements, and the description of identical technical contents is omitted. For the description of the omitted part, reference may be made to the foregoing embodiments, and the details will not be repeated in the following embodiments.

Figure 2A:
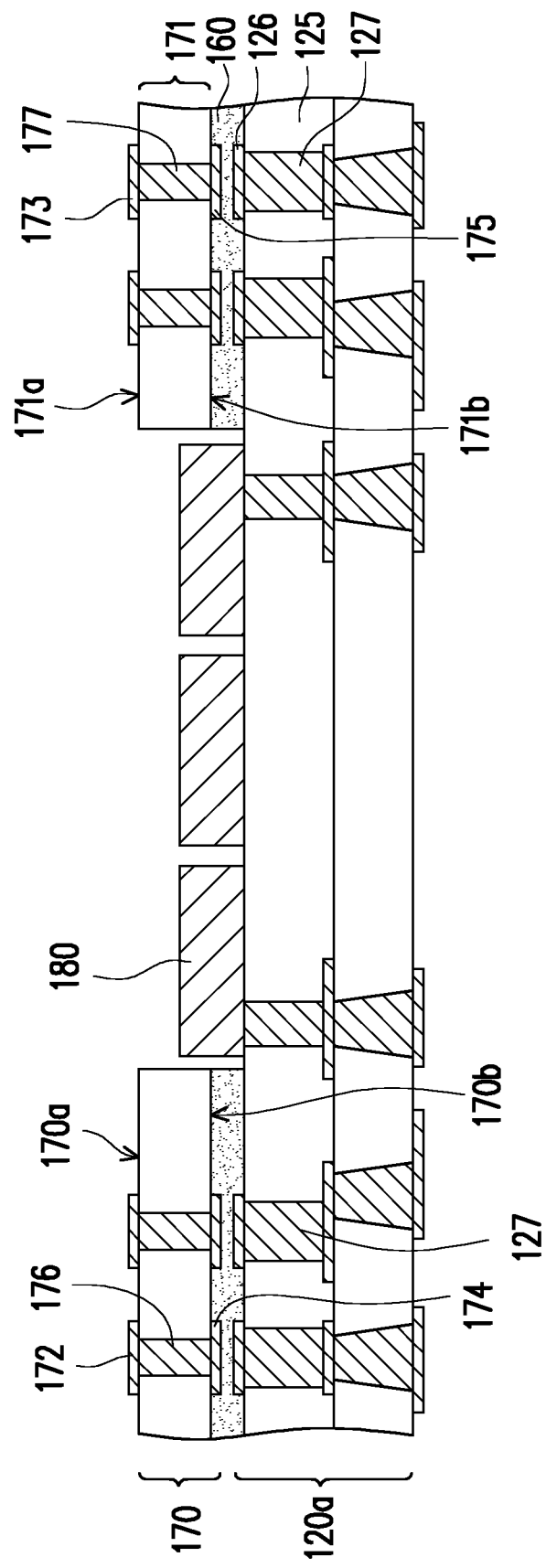
FIG. 2A to FIG. 2C are schematic cross-sectional views showing a manufacturing method of a composite substrate structure according to another embodiment of the present invention.
Figure 2B:
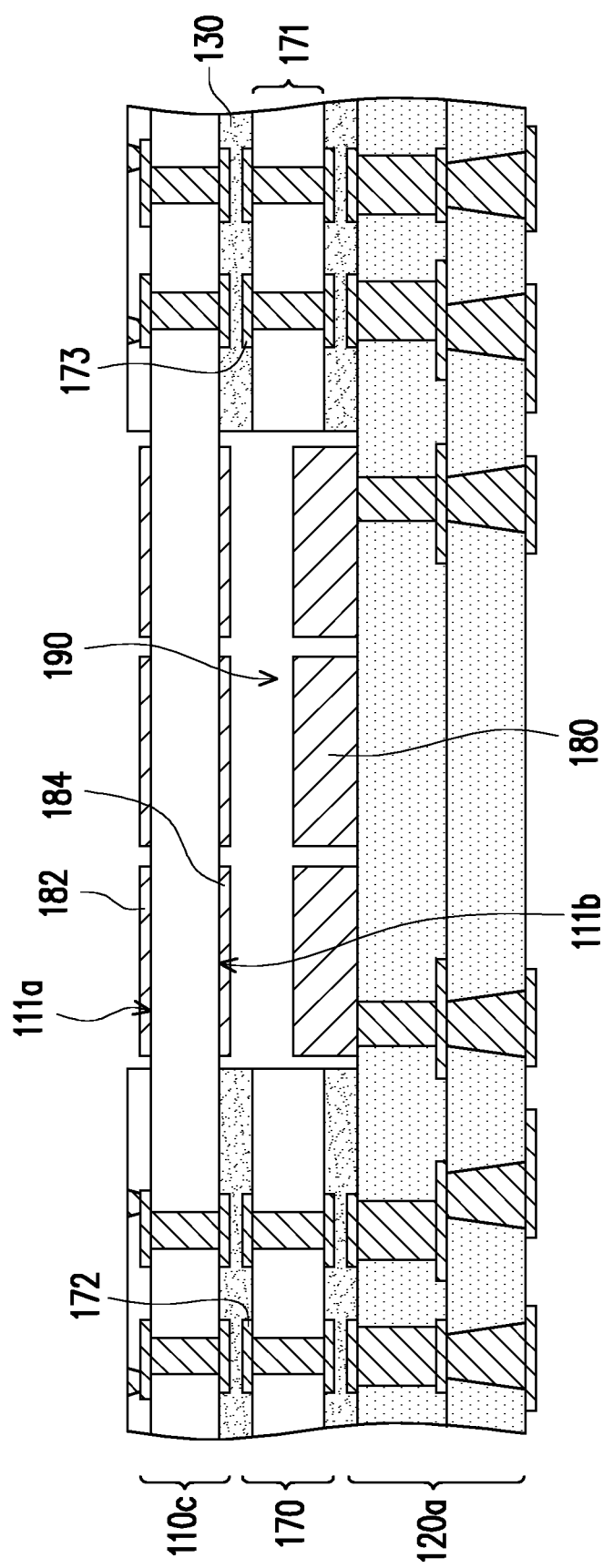
Figure 2C:
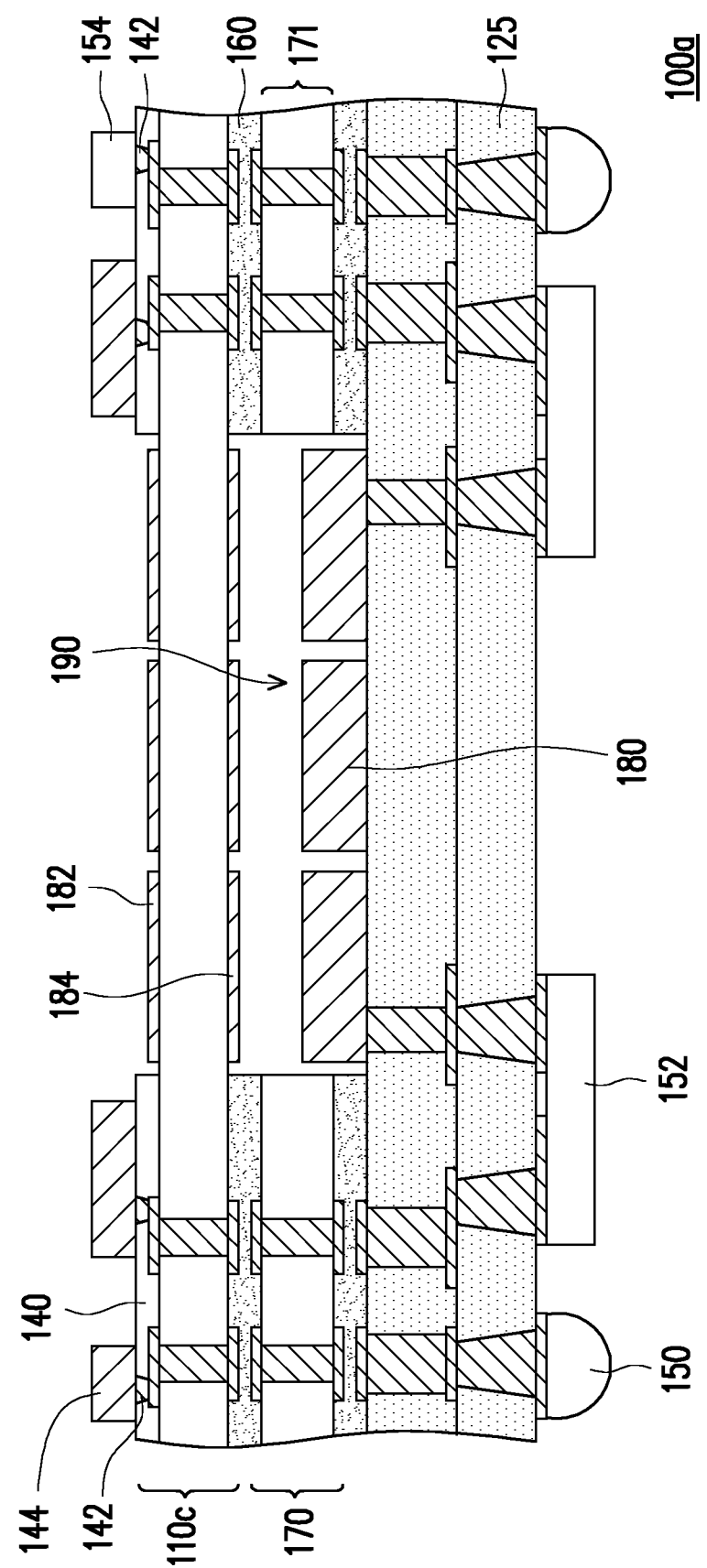

FIG. 2A to FIG. 2C are schematic cross-sectional views showing a manufacturing method of a composite substrate structure according to another embodiment of the present invention. Referring to both FIG. 1G and FIG. 2C, a composite substrate structure 100a of the present embodiment is similar to the composite substrate structure 100 of FIG. 1G, but the main difference between the two is that: the composite substrate structure 100a of the present embodiment further includes a second anisotropic conductive film 160, second glass substrates 170 and 171, a first antenna layer 180, a second antenna layer 182, a third antenna layer 184 and an electronic component 154.

Specifically, referring to FIG. 2A, a circuit substrate 120a is provided, the second anisotropic conductive film 160 is laminated onto the circuit substrate 120a, and the second glass substrates 170 and 171 are respectively disposed on the second anisotropic conductive film 160. In detail, a manufacturing method of the circuit substrate 120a of the present embodiment is substantially similar to the aforementioned manufacturing method of the circuit substrate 120, but the main difference between the two is that: the circuit substrate 120a of the present embodiment further includes the first antenna layer 180, and the first antenna layer 180 is disposed on the circuit substrate 120a.

In addition, a manufacturing method of the second glass substrates 170 and 171 of the present embodiment is also substantially similar to the aforementioned manufacturing method of the first glass substrate 110, and therefore, the description thereof will not be repeated herein, where the second glass substrate 170 has a third surface 170a and a fourth surface 170b opposite to each other. The second glass substrate 170 includes a third circuit layer 172, a fourth circuit layer 174 and a second conductive via 176. The third circuit layer 172 is disposed on the third surface 170a. The fourth circuit layer 174 is disposed on the fourth surface 170b. The second conductive via 176 penetrates the second glass substrate 170 and is electrically connected to the third circuit layer 172 and the fourth circuit layer 174. In addition, the second glass substrate 171 has a third surface 171a and a fourth surface 171b opposite to each other. The second glass substrate 171 includes a third circuit layer 173, a fourth circuit layer 175 and a second conductive via 177. The third circuit layer 173 is disposed on the third surface 171a. The fourth circuit layer 175 is disposed on the fourth surface 171b. The second conductive via 177 penetrates the second glass substrate 171 and is electrically connected to the third circuit layer 173 and the fourth circuit layer 175.

Next, after the circuit substrate 120a is provided, the second anisotropic conductive film 160 is laminated onto the second dielectric layer 125 of the circuit substrate 120a, so that the second anisotropic conductive film 160 covers a part of the second dielectric layer 125 and the third conductive layer 126, and does not cover the first antenna layer 180. Then, the second glass substrates 170 and 171 are disposed on the second anisotropic conductive film 160, and the second glass substrates 170 and 171 and the circuit substrate 120a are respectively located on two opposite sides of the second anisotropic conductive film 160. Herein, the second conductive vias 176 and 177 of the second glass substrates 170 and 171 are disposed opposite to the second conductive hole 127 of the circuit substrate 120a. Therefore, although the second conductive vias 176 and 177 of the second glass substrates 170 and 171 are not in direct contact with the second conductive hole 127 of the circuit substrate 120a, the second glass substrates 170 and 171 may still be electrically connected to the circuit substrate 120a through conductive particles in the second anisotropic conductive film 160.

Next, referring to FIG. 2B, the first anisotropic conductive film 130 is laminated onto the second glass substrates 170 and 171, and the first glass substrate 110c is disposed on the first anisotropic conductive film 130. In detail, the manufacturing method of the first glass substrate 110c of the present embodiment is substantially similar to the manufacturing method of the first glass substrate 110, but the main difference between the two is that: the first glass substrate 110c of the present embodiment further includes a second antenna layer 182 and a third antenna layer 184, the second antenna layer 182 is disposed on the first surface 111a of the first glass substrate 110c, and the third antenna layer 184 is disposed on the second surface 111b of the first glass substrate 110c. Thus, the first anisotropic conductive film 130 is laminated onto the second glass substrate 170 and 171 such that the first anisotropic conductive film 130 covers the third circuit layers 172 and 173 and does not cover the first antenna layer 180. Then, the first glass substrate 110c is disposed on the first anisotropic conductive film 130, and the first glass substrate 110c and the circuit substrate 120a are respectively located on two opposite sides of the second glass substrate 170 and 171. At this time, the first glass substrate 110c may be electrically connected to the circuit substrate 120a through the first anisotropic conductive film 130, the second glass substrates 170 and 171 and the second anisotropic conductive film 160.

Next, referring to FIG. 2C, a dielectric layer 140, a conductive via 142 and a patterned circuit layer 144 are formed on the first glass substrate 110c. An electronic component 154 is disposed on the dielectric layer 140 such that the electronic component 154 is electrically connected to the conductive via 142. The solder ball 150 and the chip 152 are respectively disposed on the second dielectric layer 125 of the circuit substrate 120a. At this time, the manufacturing of the composite substrate structure 100a of the present embodiment has been completed.

It needs to be stated that the first glass substrate 110c, the second glass substrates 170 and 171 and the circuit substrate 120a of the present embodiment may be mutually assembled to form an accommodating space 190, where the first antenna layer 180 and the third antenna layer 184 are located in the accommodating space 190 and separated from each other.

It needs to be stated that the composite substrate structure 100a of the present embodiment may be used as a part of the 5G antenna design. In addition, since the glass material in the first glass substrate 110 and the second glass substrates 170 and 171 has good mechanical properties, the composite substrate structure 100a of the present embodiment may be used to alleviate the problem of component defects or failure due to surface impact, and even may improve the receiving capability of the antenna and increase the bandwidth.

Based on the above, in the composite substrate structure and the manufacturing method thereof of the present invention, the composite substrate structure includes a circuit substrate, a first anisotropic conductive film, a first glass substrate, a dielectric layer, a patterned circuit layer and a conductive via, where the first anisotropic conductive film is disposed on the circuit substrate, and the first glass substrate is disposed on the first anisotropic conductive film, such that the first glass substrate and the circuit substrate are respectively located on two opposite sides of the first anisotropic conductive film. In addition, the first glass substrate includes a first circuit layer, a second circuit layer and at least one first conductive via. The first circuit layer is disposed on the first surface of the first glass substrate. The second circuit layer is disposed on the second surface of the first glass substrate. The first conductive via penetrates the first glass substrate and is electrically connected to the first circuit layer and the second circuit layer. With this design, the composite substrate structure of the present invention has better flatness and reliability, and the manufacturing method of the composite substrate structure of the present invention has better yield.

Although the present invention has been disclosed as above with the embodiments, it is not intended to limit the present invention. Any person of ordinary skill in the art can make some changes and modifications without departing from the spirit and scope of the present invention. Therefore, the protection scope of the present invention shall be defined by the appended claims.

What is claimed is:

1. A composite substrate structure, comprising:
    a circuit substrate, wherein the circuit substrate comprises:
        a first dielectric layer, comprising an upper surface and a lower surface opposite to each other;
        a first conductive layer, disposed on the upper surface of the first dielectric layer;
        a second conductive layer, disposed on the lower surface of the first dielectric layer;
        a first conductive hole, penetrating the first dielectric layer and electrically connected to the first conductive layer and the second conductive layer;
        a second dielectric layer, disposed on the first dielectric layer and covering the first conductive layer;
        a third conductive layer, disposed on the second dielectric layer; and
        a second conductive hole, penetrating the second dielectric layer and electrically connected to the third conductive layer and the first conductive layer;
    a first anisotropic conductive film, disposed on the circuit substrate;
    a first glass substrate, disposed on the first anisotropic conductive film and comprising a first surface and a second surface opposite to the first surface, the first glass substrate comprising:
        a first circuit layer, disposed on the first surface;
        a second circuit layer, disposed on the second surface; and
        at least one first conductive via, penetrating the first glass substrate and electrically connected to the first circuit layer and the second circuit layer;
    a dielectric layer, disposed on the first surface of the first glass substrate and covering the first circuit layer;
    a patterned circuit layer, disposed on the dielectric layer;
    a conductive via, penetrating the dielectric layer and electrically connected to the patterned circuit layer and the first circuit layer, wherein the first glass substrate and the circuit substrate are respectively located on two opposite sides of the first anisotropic conductive film; and
    at least one solder ball and at least one chip, respectively disposed on the lower surface of the first dielectric layer of the circuit substrate such that the solder ball and the chip are directly electrically connected to the second conductive layer of the circuit substrate.

2. The composite substrate structure according to claim 1, wherein the first conductive via of the first glass substrate is disposed opposite to the second conductive hole of the circuit substrate.

3. The composite substrate structure according to claim 1, wherein the first glass substrate is electrically connected to the circuit substrate through the first anisotropic conductive film.

4. The composite substrate structure according to claim 1, further comprising:
    a second anisotropic conductive film, disposed on the circuit substrate; and
    at least two second glass substrates, respectively disposed on the second anisotropic conductive film, the second glass substrate comprising a third surface and a fourth surface opposite to each other and comprising:
        a third circuit layer, disposed on the third surface;
        a fourth circuit layer, disposed on the fourth surface; and
        a second conductive via, penetrating the second glass substrate and electrically connected to the third circuit layer and the fourth circuit layer,
    wherein the first glass substrate and the circuit substrate are respectively located on two opposite sides of the second glass substrate, and the second glass substrate and the circuit substrate are respectively located on two opposite sides of the second anisotropic conductive film.

5. The composite substrate structure according to claim 4, wherein the first glass substrate is electrically connected to the circuit substrate through the first anisotropic conductive film, the second glass substrate and the second anisotropic conductive film.

6. The composite substrate structure according to claim 4, wherein the circuit substrate further comprises a first antenna layer disposed on the circuit substrate,
the first glass substrate further comprises a second antenna layer and a third antenna layer respectively disposed on the first surface and the second surface of the first glass substrate, and
the composite substrate structure further comprises an electronic component disposed on the dielectric layer and electrically connected to the conductive via.

7. The composite substrate structure according to claim 6, wherein the first glass substrate, the at least two second glass substrates and the circuit substrate are mutually assembled to form an accommodating space, and the first antenna layer and the third antenna layer are located in the accommodating space and separated from each other.

8. A manufacturing method of a composite substrate structure, comprising:
providing a circuit substrate, wherein the circuit substrate comprises:
a first dielectric layer, comprising an upper surface and a lower surface opposite to each other;
a first conductive layer, disposed on the upper surface of the first dielectric layer;
a second conductive layer, disposed on the lower surface of the first dielectric layer;
a first conductive hole, penetrating the first dielectric layer and electrically connected to the first conductive layer and the second conductive layer;
a second dielectric layer, disposed on the first dielectric layer and covering the first conductive layer;
a third conductive layer, disposed on the second dielectric layer; and
a second conductive hole, penetrating the second dielectric layer and electrically connected to the third conductive layer and the first conductive layer;
laminating a first anisotropic conductive film onto the circuit substrate;
disposing a first glass substrate on the first anisotropic conductive film, the first glass substrate comprising a first surface and a second surface opposite to the first surface, and the first glass substrate comprising:
a first circuit layer, disposed on the first surface;
a second circuit layer, disposed on the second surface; and
at least one first conductive via, penetrating the first glass substrate and electrically connected to the first circuit layer and the second circuit layer;
laminating a dielectric layer onto the first surface of the first glass substrate and covering the first circuit layer;
forming a conductive via penetrating the dielectric layer;
forming a patterned circuit layer on the dielectric layer, wherein the conductive via is electrically connected to the patterned circuit layer and the first circuit layer, and the first glass substrate and the circuit substrate are respectively located on two opposite sides of the first anisotropic conductive film; and
disposing at least one solder ball and at least one chip respectively on the lower surface of the first dielectric layer of the circuit substrate such that the solder ball and the chip are directly electrically connected to the second conductive layer.

9. The manufacturing method of the composite substrate structure according to claim 8, wherein the step of forming the first glass substrate comprises:
providing a glass substrate, the glass substrate comprising a first surface, a second surface opposite to the first surface, and at least one via penetrating the glass substrate;
forming a seed layer on the first surface and the second surface and in the via of the glass substrate;
forming a patterned photoresist layer on the seed layer of the first surface and on the seed layer of the second surface;
forming a conductive material layer on the seed layer exposed by the patterned photoresist layer; and
removing the patterned photoresist layer, a part of the conductive material layer and a part of the seed layer to form the first circuit layer, the second circuit layer and the at least one first conductive via.

10. The manufacturing method of the composite substrate structure according to claim 8, wherein the first conductive via of the first glass substrate is disposed opposite to the second conductive hole of the circuit substrate.

11. The manufacturing method of the composite substrate structure according to claim 8, wherein the first glass substrate is electrically connected to the circuit substrate through the first anisotropic conductive film.

12. The manufacturing method of the composite substrate structure according to claim 8, before laminating the first anisotropic conductive film onto the circuit substrate, further comprising:
laminating a second anisotropic conductive film onto the circuit substrate; and
disposing at least two second glass substrates respectively on the second anisotropic conductive film, the second glass substrate comprising a third surface and a fourth surface opposite to each other and comprising:
a third circuit layer, disposed on the third surface;
a fourth circuit layer, disposed on the fourth surface; and
a second conductive via, penetrating the second glass substrate and electrically connected to the third circuit layer and the fourth circuit layer,
wherein the first glass substrate and the circuit substrate are respectively located on two opposite sides of the second glass substrate, and the second glass substrate and the circuit substrate are respectively located on two opposite sides of the second anisotropic conductive film.

13. The manufacturing method of the composite substrate structure according to claim 12, wherein the first glass substrate is electrically connected to the circuit substrate through the first anisotropic conductive film, the second glass substrate and the second anisotropic conductive film.

14. The manufacturing method of the composite substrate structure according to claim 12, wherein the circuit substrate further comprises a first antenna layer disposed on the circuit substrate,
the first glass substrate further comprises a second antenna layer and a third antenna layer respectively disposed on the first surface and the second surface of the first glass substrate, and
the composite substrate structure further comprises an electronic component disposed on the dielectric layer and electrically connected to the conductive via.

15. The manufacturing method of the composite substrate structure according to claim 14, wherein the first glass substrate, the two second glass substrates and the circuit substrate are mutually assembled to form an accommodating space, and the first antenna layer and the second antenna layer are both located in the accommodating space.

\* \* \* \* \*